United States Patent
Kraus

(10) Patent No.: US 11,528,816 B2
(45) Date of Patent: Dec. 13, 2022

(54) ELECTRONIC CONTROL MODULE AND METHOD FOR PRODUCING AN ELECTRONIC CONTROL MODULE

(71) Applicant: Robert Bosch GmbH, Stuttgart (DE)

(72) Inventor: Matthias Kraus, Gotha Ot Uelleben (DE)

(73) Assignee: Robert Bosch GmbH, Stuttgart (DE)

( * ) Notice: Subject to any disclaimer, the term of this patent is extended or adjusted under 35 U.S.C. 154(b) by 641 days.

(21) Appl. No.: 16/494,225

(22) PCT Filed: Jan. 22, 2018

(86) PCT No.: PCT/EP2018/051455
§ 371 (c)(1),
(2) Date: Sep. 13, 2019

(87) PCT Pub. No.: WO2018/166679
PCT Pub. Date: Sep. 20, 2018

(65) Prior Publication Data
US 2020/0045840 A1   Feb. 6, 2020

(30) Foreign Application Priority Data
Mar. 15, 2017   (DE) .................... 10 2017 204 338.5

(51) Int. Cl.
*G01D 11/24*   (2006.01)
*H05K 5/00*   (2006.01)
(Continued)

(52) U.S. Cl.
CPC ......... *H05K 5/0082* (2013.01); *G01D 11/245* (2013.01); *H05K 1/028* (2013.01);
(Continued)

(58) Field of Classification Search
CPC ...... H05K 5/0082; H05K 1/028; H05K 1/147; H05K 1/181; H05K 1/189; H05K 3/284;
(Continued)

(56) References Cited

U.S. PATENT DOCUMENTS 5,408,383 A * 4/1995 Nagasaka ............. H01L 25/162
361/752
7,147,486 B2   12/2006 Clark
(Continued)

FOREIGN PATENT DOCUMENTS

CN   104955290 A   9/2015
CN   104955299 A   9/2015
(Continued)

OTHER PUBLICATIONS

International Search Report corresponding to PCT Application No. PCT/EP2018/051455, dated Jun. 19, 2018 (German and English language document) (7 pages).

*Primary Examiner* — Binh B Tran
(74) *Attorney, Agent, or Firm* — Maginot, Moore & Beck LLP

(57) ABSTRACT

An electronic control module, particularly for a transmission, includes a first circuit board element and a sensor unit carrier fastened to the first circuit board element. The sensor unit carrier has a sensor unit receptacle configured to receive a sensor unit. The sensor unit has a sensor element fastened and electrically connected to a second circuit board element so as to detect at least one measured value. The sensor unit is fastened in the sensor unit receptacle. The second circuit board element has a flexible region that separates a first sub-region of the second circuit board element from a second sub-region of the second circuit board element. The first sub-region has a predetermined angle to the second sub-region. The sensor element is electrically connected to
(Continued)

the first circuit board element by the second sub-region of the second circuit board element.

16 Claims, 1 Drawing Sheet

(51) Int. Cl.
| | | |
|---|---|---|
| H05K 1/02 | (2006.01) | |
| H05K 1/14 | (2006.01) | |
| H05K 1/18 | (2006.01) | |
| H05K 3/28 | (2006.01) | |
| H05K 3/32 | (2006.01) | |
| H05K 3/36 | (2006.01) | |
| H05K 5/06 | (2006.01) | |
| B60R 16/023 | (2006.01) | |

(52) U.S. Cl.
CPC ............ *H05K 1/147* (2013.01); *H05K 1/181* (2013.01); *H05K 1/189* (2013.01); *H05K 3/284* (2013.01); *H05K 3/32* (2013.01); *H05K 3/361* (2013.01); *H05K 5/065* (2013.01); *B60R 16/0231* (2013.01); *B60Y 2200/90* (2013.01); *H05K 2201/10151* (2013.01); *H05K 2201/10265* (2013.01); *H05K 2203/1316* (2013.01); *H05K 2203/1327* (2013.01)

(58) Field of Classification Search
CPC .......... H05K 3/32; H05K 3/361; H05K 5/065; H05K 2201/10151; H05K 2201/10265; H05K 2203/1316; H05K 2203/1327; G01D 11/245; B60R 16/0231; B60Y 2200/90
See application file for complete search history.

(56) References Cited

U.S. PATENT DOCUMENTS

| | | | |
|---|---|---|---|
| 7,897,913 B2* | 3/2011 | Drotleff | ............... H04N 5/2253 |
| | | | 250/239 |
| 2004/0045736 A1 | 3/2004 | Jungbauer et al. | |
| 2007/0131854 A1 | 6/2007 | Shin et al. | |
| 2012/0006907 A1 | 1/2012 | Niemann et al. | |
| 2018/0077808 A1* | 3/2018 | Seo | .......... G06F 3/044 |

FOREIGN PATENT DOCUMENTS

| | | |
|---|---|---|
| DE | 10 2013 212 940 A1 | 12/2014 |
| DE | 10 2014 205 385 A1 | 9/2015 |
| DE | 10 2014 205 386 A1 | 9/2015 |
| WO | 2009/153256 A1 | 12/2009 |
| WO | 2014/187834 A2 | 11/2014 |

* cited by examiner

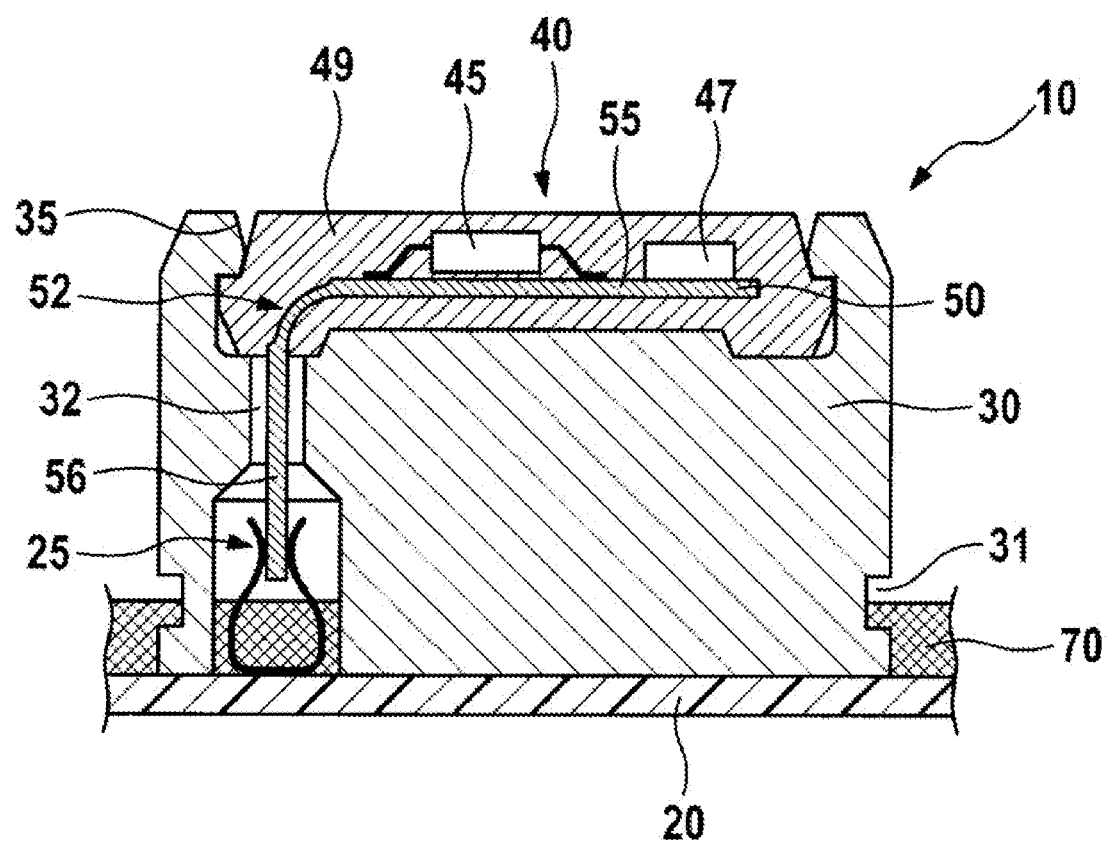

ELECTRONIC CONTROL MODULE AND METHOD FOR PRODUCING AN ELECTRONIC CONTROL MODULE

This application is a 35 U.S.C. § 371 National Stage Application of PCT/EP2018/051455, filed on Jan. 22, 2018, which claims the benefit of priority to Serial No. DE 10 2017 204 338.5, filed on Mar. 15, 2017 in Germany, the disclosures of which are incorporated herein by reference in their entirety.

BACKGROUND

The disclosure relates to an electronic control module and to a method for producing an electronic control module.

A large number of electronic control modules, in particular for a transmission, are known. The electronic control modules often comprise a sensor or a sensor element by means of which measurement values or measurement data are detected. The sensor element can be part of a sensor unit. The sensor or the sensor unit has to be arranged at predetermined positions or distances relative to the element or object to be measured. The position of the control module or of a first printed circuit board element of the control module is often prespecified as well. Therefore, the sensor or the sensor unit has to be arranged at a predetermined distance or at a predetermined height from the first printed circuit board element. A sensor unit support which is fixed on the first printed circuit board element is typically used for this purpose. The sensor unit is or will be fixed to the sensor unit support on a side of the sensor unit support that is averted from the first printed circuit board element.

A cable or a leadframe is generally used for electrical connection between the first printed circuit board element and the sensor or the sensor unit. In the case of connection using a cable, manufacture is very complicated, amongst other things since a large number of different contact-making technologies are used. Complex and expensive production tools are required in the case of a leadframe as the electrical connecting element between the sensor or sensor unit and the first printed circuit board element. In addition, the tools cannot be changed quickly, and therefore the position of the sensor unit cannot be easily changed during the production process, amongst other things since other tools are required and the production process has to be adapted in a complex manner.

In addition, the angle between the sensor or the sensor unit and the printed circuit board element can be changed only in a very complex manner during the production process.

SUMMARY

Embodiments of the present disclosure can advantageously enable the distance of the sensor element from the first printed circuit board element and also the angle of the sensor element relative to the first printed circuit board element to be changed in a technically simple manner or to be adapted during production.

A first aspect of the disclosure proposes an electronic control module, in particular for a transmission, comprising—a first printed circuit board element, —a sensor unit support which is fixed on the first printed circuit board element and has a sensor unit receptacle for receiving a sensor unit,—the sensor unit with a sensor element, which is fixed on a second printed circuit board element and is electrically connected to the second printed circuit board element, for detecting at least one measurement value, wherein the sensor unit is fixed in the sensor unit receptacle, characterized in that the second printed circuit board element has a flexible region, wherein the flexible region separates a first subregion of the second printed circuit board element from a second subregion of the second printed circuit board element, wherein the first subregion is at a predetermined angle in relation to the second subregion, and the sensor element is electrically connected to the first printed circuit board element by means of the second subregion of the second printed circuit board element.

One advantage of this is that the distance of the sensor unit or of the sensor element from the first printed circuit board element can typically be adapted or changed in a technically simple manner during the production process. Furthermore, the angle or the orientation between the sensor unit or the sensor element and the first printed circuit board element can generally be changed or adapted in a technically simple manner during the production process since the second printed circuit board element comprises a flexible or semiflexible or pliable region. Furthermore, the sensor unit or the sensor element generally do not have to run through processes for covering electronic components on the first printed circuit board element, but rather can be arranged only after these processes. Therefore, the sensor unit or the sensor element typically does not have to be designed to be particularly resistant, in particular to heating or heat. In addition, additional connecting elements, such as leadframes and/or cables for example, for electrically connecting the sensor element to the first printed circuit board element are generally not required. The length of the second subregion of the second printed circuit board element can generally be adapted to the required connection length between the sensor unit or the sensor unit and the first printed circuit board element.

A second aspect of the disclosure proposes a method for producing an electronic control module, in particular for a transmission, wherein the method comprises the following steps:—providing a first printed circuit board element;—providing a sensor unit, wherein the sensor unit has a second printed circuit board element which is separated by a flexible region into a first subregion and a second subregion, wherein the first subregion is at a predetermined angle in relation to the second subregion, wherein the sensor unit further has a sensor element, which is fixed on the first subregion of the second printed circuit board element and is electrically connected to the second printed circuit board element, for detecting at least one measurement value, wherein the sensor element is closed off in an oil-tight manner from the surrounding area by a sealing-off material;—arranging a sensor unit support on the first printed circuit board element and connecting the sensor unit support to the first printed circuit board element, wherein the sensor unit support has a sensor unit receptacle for receiving the sensor unit; and—arranging and fixing the sensor unit in the sensor unit receptacle in such a way that the sensor is electrically connected to the first printed circuit board element by means of the second subregion.

The advantage of this is that the height or the distance of the sensor or the sensor unit from the first printed circuit board element can generally be adapted or changed in a technically simple manner during the production process by changing the height of the sensor unit support. In addition, the angle between the sensor or the sensor unit and the first printed circuit board element can typically be changed or adapted in a technically simple manner since the second printed circuit board element comprises a flexible or semiflexible or pliable region. Any desired angle can generally be achieved between the sensor and the first printed circuit board element by bending the flexible or semiflexible subregion of the second printed circuit board element (before sealing off in an oil-tight manner using sealing-off material). The length of the second subregion of the second printed circuit board element which can be adapted (to the height of the sensor unit support) typically provides for a secure electrical connection between the sensor or the sensor unit and the first printed circuit board element without additional elements, such as cables and/or leadframes for example.

Concepts concerning embodiments of the present disclosure can be regarded, amongst other things, as being based on the ideas and insights described below.

According to one embodiment, the sensor unit support has a hollow space for receiving an electrical connecting region between the second subregion of the second printed circuit board element and the first printed circuit board element, wherein the hollow space is sealed off in an oil-tight manner from the surrounding area, in particular by the sensor unit. One advantage of this is that the electrical connecting region between the second subregion of the second printed circuit board element and the first printed circuit board element is typically particularly effectively protected from the surrounding area. In particular, the electrical connecting region or the electrical connection is generally not adversely affected even in the event of a change in shape of the sensor unit support since the material of the sensor unit support is at a distance from the electrical connecting region.

According to one embodiment, the sensor unit support comprises a thermoplastic, in particular the sensor unit support consists of a thermoplastic. The advantage of this is that the control module can generally be produced in a technically cost-effective manner since thermoplastic is inexpensive.

According to one embodiment, the second subregion of the second printed circuit board element is electrically connected to the first printed circuit board element by means of a spring contact connection. One advantage of this is that the electrical connection can typically be established in a technically simple manner and without a view of or access to the spring contact connection from the outside.

According to one embodiment, the sensor element, in particular the sensor unit, and the flexible region of the second printed circuit board element is sealed off in an oil-tight manner from the surrounding area by a thermoset material. As a result, the electrical connection or the electrical connecting region between the second subregion of the printed circuit board element and the first printed circuit board element is generally protected from the surrounding area in a technically particularly simple manner.

According to one embodiment of the method, before arranging and fixing the sensor unit in the sensor unit receptacle, the following steps are executed: applying an encapsulation material for sealing off electrical components on the first printed circuit board element in an oil-tight manner from the surrounding area; and curing the encapsulation material. The advantage of this is that the sensor unit is typically applied to the sensor unit support only after the encapsulation material is cured. Consequently, the sensor unit is generally spared from the effects of curing of the encapsulation material or measures for curing the encapsulation material (for example heating). Therefore, the sensor unit can generally consist of a cost-effective material or comprise a material of this kind, in particular a material which is heat-sensitive.

According to one embodiment of the method, the second subregion of the second printed circuit board element is electrically connected to the first printed circuit board element by means of a spring contact connection. The advantage of this is that the electrical connection is generally established in a technically simple manner and without a view of or access to the spring contact connection from the outside.

According to one embodiment of the method, a height of the sensor unit support is matched to a prespecified height by removing a portion of the sensor unit support. As a result, the distance of the sensor or the sensor unit from the first printed circuit board element can typically be adapted or adjusted to a prespecified/desired height in a technically simple manner.

According to one embodiment of the method, the sensor unit is arranged and connected to the sensor unit support in such a way that a hollow space of the sensor unit support, in which an electrical connection is established between the second subregion and the first printed circuit board element, is closed off in an oil-tight manner from the surrounding area. The advantage of this is that the electrical connection or the electrical connecting region between the second subregion of the printed circuit board element and the first printed circuit board element is typically protected from the surrounding area in a technically particularly simple manner. In particular, additional steps and/or additional elements or components for sealing off the hollow space and the electrical connection are generally not required.

It should be noted that some of the possible features and advantages of the disclosure are described herein with reference to different embodiments of the electronic control module or of the method for producing an electronic control module. A person skilled in the art recognizes that the features can be combined, adapted or exchanged in a suitable way to arrive at further embodiments of the disclosure.

BRIEF DESCRIPTION OF THE DRAWINGS

Embodiments of the disclosure are described below with reference to the accompanying drawing, wherein neither the drawing nor the description should be construed as restricting the disclosure.

FIG. 1 shows a cross-sectional view through one embodiment of the electronic control module according to the disclosure.

The FIGURE is merely schematic and not true to scale.

DETAILED DESCRIPTION

FIG. 1 shows a cross-sectional view through one embodiment of the electronic control module 10 according to the disclosure. The electronic control module 10 is, for example, part of a controller for a transmission. It is also conceivable for the control module 10 to be used in an electric vehicle.

The electronic control module 10 comprises a first printed circuit board element 20. The first printed circuit board element 20 can be, for example, a printed circuit board (PCB). Electronic components can be arranged on the first printed circuit board element 20.

At least one portion of the first printed circuit board element 20 is covered by an encapsulation material 70. The encapsulation material 70 covers electronic components which are arranged on the first printed circuit board element 20 and protects them from the surrounding area. In particular, the encapsulation material 70 is of oil-tight design, so that the electronic components can be sealed off from an oil environment in which the control module 10 can be arranged.

A sensor unit support 30 is arranged on the first printed circuit board element 20 and fixed to the first printed circuit board element 20. The sensor unit support 30 can be fixed to the first printed circuit board element 20 by means of the encapsulation material 70 which is present at least partially in an (encircling) lateral cutout 31 of the sensor unit support 30 which is provided for this purpose. As an alternative or in addition, the sensor unit support 30 can be fixed to the first printed circuit board element 20 by soldering (in particular reflow soldering).

The position of the sensor unit support 30 on the first printed circuit board element 20 can be easily adapted or changed during the production of the electronic control module 10 since only the position of the electrical connecting element (for example of the spring contact element 25) between the second printed circuit board element 50 and the first printed circuit board element 20 on the first printed circuit board element 20 has to be changed.

The sensor unit support 30 can comprise a thermoplastic (for example PPS) or consist of said thermoplastic. The height (which runs perpendicularly in relation to the first printed circuit board element 20; which runs from bottom to top in FIG. 1) of the sensor unit support 30 can be changed. To this end, a section or region of the sensor unit support 30, which section or region is at the bottom in FIG. 1, can be removed, for example can be cut off or milled off, before arranging the sensor unit support 30 on the first printed circuit board element 20. The sensor unit support 30 rests flat on the first printed circuit board element 20.

The sensor unit support 30 has, on that side which is averted from the first printed circuit board element 20, a sensor unit receptacle 35. The sensor unit receptacle 35 can comprise or be, for example, a recess. A sensor unit 40 is arranged and fixed to the sensor unit support 30 in the sensor unit receptacle 35. The fastening can be achieved by adhesive bonding and/or plug-connection. The sensor unit 40 can be arranged and fixed after the encapsulation material 70 is applied and cured.

The sensor unit 40 has a second printed circuit board element 50. The second printed circuit board element 50 can be, for example, a printed circuit board. A sensor element 45 for detecting at least one measurement value (for example a rotation speed) and also, under certain circumstances, further electronic components 47 can be arranged and fixed on the second printed circuit board element 50. The sensor element 45 and the further electronic components 47 which may be present are surrounded by a sealing-off material 49, so that the sensor element 45 and the further electronic components 47 are sealed off from the surrounding area, in particular in an oil-tight or transmission fluid-tight manner (leakproof in respect of automatic transmission fluid). The sealing-off material 49 can comprise, in particular, a thermoset material or can be a thermoset material.

The second printed circuit board element 50 has a flexible or semiflexible pliable subregion or region 52 which separates or splits the second printed circuit board element 50 into a first subregion 55 (running from top to bottom in FIG. 1) and a second subregion 56 (running from left to right in FIG. 1). The flexible region 52 of the second printed circuit board element 50 can be formed, in particular, by removing a portion of the second printed circuit board element 50. To this end, a portion of the second printed circuit board element 50 is removed at least from a first side of the second printed circuit board element 50. The second printed circuit board element 50 is, as it were, thinned in the flexible region 52. In addition, a portion of the second printed circuit board element 50 can also be removed from a second side of the printed circuit board element 50 which is situated opposite the first side of the second printed circuit board element 50. This can be carried out, for example, by milling it off. The second printed circuit board element 50 is then pliable in the flexible region 52. The maximum achievable angle between the first subregion 55 and the second subregion 56 can be, for example, approximately 120° or approximately 150°.

The length of the second subregion 56 of the second printed circuit board element 50 can be adjusted by changing the position of the flexible region 52 of the second printed circuit board element 50. This is adapted to the height of the sensor unit support 30, so that an electrical connection to the first printed circuit board element 20 can be securely established by inserting the second subregion 56 of the second printed circuit board element 50 into the hollow space 32 of the sensor unit support 30.

The flexible region 52 is bent before the sensor element 45 and the first subregion 55 of the second printed circuit board element 50 are surrounded by the sealing-off material 49, that is to say before the sensor unit 40 is sealed off. The surrounding operation can be carried out, for example, by encapsulation by injection-molding. The flexible region 52 is bent in such a way that a prespecified or desired angle between the first subregion 55 of the second printed circuit board element 50 and the second subregion 56 of the second printed circuit board element 50 is achieved. Since the angle between the second subregion 56 of the second printed circuit board element 50 and the first printed circuit board element 20 is usually approximately 90°, the angle between the first printed circuit board element 20 and the sensor element 45 or the first subregion 55 of the second printed circuit board element 50 is also adjusted in this way. Therefore, irrespective of the angle of the sensor element 45 in relation to the first printed circuit board element 20, the second subregion 56 of the second printed circuit board element 50 can always be at an angle of approximately 90° in relation to the first printed circuit board element 20. This facilitates the electrical connection between the second printed circuit board element 50 and the first printed circuit board element 20.

The sensor unit support 30 can be adapted to the angle between the first subregion 55 and the second subregion 56, so that the side of the sensor unit support 30 that is averted from the first printed circuit board element 10 runs substantially parallel in relation to the first subregion 55 of the second printed circuit board element 50. Conversely, the sensor unit 40 can correspondingly be matched to the sensor unit support 30.

The sealing-off material 49 completely surrounds the flexible region 52 of the second printed circuit board element 50. A portion of the second subregion 56 of the second printed circuit board element 50 can be surrounded by the sealing-off material 49. However, it is also conceivable for the second subregion 56 of the second printed circuit board element 50 to be free of sealing-off material 49.

An end of the second subregion 56 of the second printed circuit board element 50 that is averted from the flexible region 52 of the second printed circuit board element 50 is electrically connected to the first printed circuit board element 20 by means of a (SMD) spring contact connection. Since the second subregion 56 of the second printed circuit board element 50 is electrically connected to the sensor element 45 by means of the flexible region 52 of the second printed circuit board element 50 and the first subregion 55 of the second printed circuit board element 50, the sensor element 45 is electrically connected to the first printed circuit board element 20 in this way.

The sensor unit support 30 has a hollow space 32 which is open in the direction of the first printed circuit board element 20. The second subregion 56 of the second printed circuit board element 50 is inserted into the hollow space 32 and, on account of guidance of the sensor unit support 30, enters the spring contact element 25.

The hollow space 32 is sealed off in a liquid-tight or oil-tight manner from the surrounding area by the sensor unit 40, in particular by the sealing-off material 49 of the sensor unit 40, in the direction away from the first printed circuit board element 20. In this way, the hollow space 32 and the electrical contact between the second subregion 56 of the second printed circuit board element 50 and the first printed circuit board element 20 are sealed off in an oil-tight manner from the surrounding area in a technically simple manner.

Finally, it should be noted that terms such as "having", "comprising" etc. do not exclude other elements or steps, and terms such as "a" or "an" do not exclude a multiplicity. Reference signs in the claims are not intended to be regarded as restrictive.

The invention claimed is:

1. An electronic control module, comprising:
a first printed circuit board element;
a sensor unit with a sensor element configured to detect at least one measurement value, the sensor element fixed on a second printed circuit board element and electrically connected to the second printed circuit board element; and
a sensor unit support that is fixed on the first printed circuit board element and has a sensor unit receptacle configured to receive the sensor unit, the sensor unit fixed in the sensor unit receptacle,
wherein
the second printed circuit board element has a flexible region that separates a first subregion of the second printed circuit board element from a second subregion of the second printed circuit board element,
the first subregion is at a predetermined angle in relation to the second subregion,
the sensor element is electrically connected to the first printed circuit board element by the second subregion of the second printed circuit board element, and
the second subregion is positioned between the flexible region and the first printed circuit board.

2. The electronic control module as claimed in claim 1, wherein the sensor unit support has a hollow space configured to receive an electrical connecting region of the second printed circuit board which is located between the second subregion of the second printed circuit board element and the first printed circuit board element, and wherein the hollow space is sealed off in an oil-tight manner from the surrounding area.

3. The electronic control module as claimed in claim 1, wherein the sensor unit support comprises a thermoplastic.

4. The electronic control module as claimed in claim 1, further comprising:
a spring contact element positioned on the first printed circuit board and coupled with the second subregion of the second printed circuit board element whereby the second printed circuit board is electrically connected to the first printed circuit board element.

5. The electronic control module as claimed in claim 1, wherein the sensor element and the flexible region of the second printed circuit board element is sealed off in an oil-tight manner from the surrounding area by a thermoset material.

6. A method for producing an electronic control module that includes a first printed circuit board element and a sensor unit, the sensor unit has a second printed circuit board element with a first subregion that is separated from a second subregion by a flexible region of the second printed circuit board element, the first subregion is at a predetermined angle in relation to the second subregion, the sensor unit further has a sensor element configured to detect at least one measurement value, the sensor element is fixed on the first subregion of the second printed circuit board element and is electrically connected to the second printed circuit board element, the sensor element is closed off in an oil-tight manner from the surrounding area by a sealing-off material, the method comprising:
arranging a sensor unit support on the first printed circuit board element and connecting the sensor unit support to the first printed circuit board element, wherein the sensor unit support has a sensor unit receptacle configured to receive the sensor unit; and
arranging and fixing the sensor unit in the sensor unit receptacle such that the sensor element is electrically connected to the first printed circuit board element by the second subregion through the flexible region of the second printed circuit board element by inserting the second subregion into a hollow space of the sensor unit support, the hollow space extending downwardly from the sensor unit receptacle toward a bottom of the sensor unit support.

7. The method as claimed in claim 6, wherein, before arranging and fixing the sensor unit in the sensor unit receptacle, the method further comprises:
applying an encapsulation material configured to seal off electrical components on the first printed circuit board element in an oil-tight manner from the surrounding area; and
curing the encapsulation material.

8. The method as claimed in claim 6, wherein arranging and fixing the sensor unit in the sensor unit receptacle further comprises:
coupling the second subregion of the second printed circuit board element with a spring contact element whereby the second subregion is electrically connected to the first printed circuit board element.

9. The method as claimed in claim 6, wherein a height of the sensor unit support is matched to a prespecified height by removing a portion of the sensor unit support.

10. The method as claimed in claim 6, wherein the sensor unit is arranged and connected to the sensor unit support such that an upper end of the hollow space of the sensor unit support, in which the electrical connection is established between the second subregion and the first printed circuit board element, is closed off in an oil-tight manner from the surrounding area.

11. The electronic control module as claimed in claim 1, wherein the electronic control module is configured for a transmission.

12. The electronic control module as claimed in claim 2, wherein the hollow space is sealed off at an upper end of the hollow space in the oil-tight manner from the surrounding area by the sensor unit.

13. The electronic control module as claimed in claim 2, wherein the sensor unit support consists of a thermoplastic.

14. The electronic control module as claimed in claim 5, wherein the sensor unit and the flexible region of the second printed circuit board element is sealed off in the oil-tight manner from the surrounding area by the thermoset material.

15. The electronic control module of claim 1, wherein:
the sensor element is mounted to the first subregion;
the first subregion is located in the sensor unit receptacle;
the second subregion is located in a hollow space of the sensor unit support;
the hollow space extends from the sensor unit receptacle toward a bottom of the sensor unit support; and
the bottom of the sensor unit support is located on an upper surface of the first printed circuit board element.

16. The electronic control module of claim 15, further comprising: a spring contact element positioned on the upper surface of the first printed circuit board and coupled with the second subregion of the second printed circuit board element within the hollow space.

* * * * *